US006864742B2

(12) United States Patent
Kobayashi

(10) Patent No.: US 6,864,742 B2
(45) Date of Patent: Mar. 8, 2005

(54) APPLICATION OF THE DOHERTY AMPLIFIER AS A PREDISTORTION CIRCUIT FOR LINEARIZING MICROWAVE AMPLIFIERS

(75) Inventor: Kevin W. Kobayashi, Torrance, CA (US)

(73) Assignee: Northrop Grumman Corporation, Los Angeles, CA (US)

(*) Notice: Subject to any disclaimer, the term of this patent is extended or adjusted under 35 U.S.C. 154(b) by 0 days.

(21) Appl. No.: 09/878,104

(22) Filed: Jun. 8, 2001

(65) Prior Publication Data

US 2002/0186078 A1 Dec. 12, 2002

(51) Int. Cl.[7] ............................................. H03F 3/68
(52) U.S. Cl. ..................... 330/124 R; 330/53; 330/129; 330/136; 330/149
(58) Field of Search ............................. 330/53, 124 R, 330/129, 136, 149

(56) References Cited

U.S. PATENT DOCUMENTS

| 4,121,055 A | 10/1978 | Doherty |
| 4,532,477 A | 7/1985 | Green, Jr. et al. |
| 4,590,436 A | * 5/1986 | Butler et al. ................ 330/277 |
| 4,739,307 A | 4/1988 | Marcovici et al. |
| 5,012,200 A | 4/1991 | Meinzer |

(List continued on next page.)

FOREIGN PATENT DOCUMENTS

| EP | 0368329 | 5/1990 |
| EP | 0451909 | 10/1991 |
| JP | 06069731 | 11/1994 |

OTHER PUBLICATIONS

McMorrow, et al., "The Microwave Doherty Amplifier," IEEE MTT–S Digest, 1994, pp. 1653–1656.
Campbell, "A Fully Integrated Ku–Band Doherty Amplifier MMIC," IEEE Microwave and Guided Wave Letters, pp. 114–116, vol. 9, No. 3, Mar. 1999.
Yang, et al. "High Linearity K–Band InP HBT Power Amplifier MMIC with 62.8%PAE at 21 GHz," pp. 73–76, GaAs IC Symp. Dig., Monteray, CA 1999.
Asbeck, et al. "Improved Transceiver Architectures and Circuits for CMOS Radio Frequency Applications," Final Report 1998–99 for Micro Project 98–073, Hughes Electronics and Rockwell International.

(List continued on next page.)

*Primary Examiner*—Michael J. Tokar
*Assistant Examiner*—Khai Nguyen
(74) *Attorney, Agent, or Firm*—John S. Paniaguas; Katten Muchin Zavis Rosenman

(57) ABSTRACT

A predistortion circuit for a microwave amplifier and more particularly to predistortion circuit configured as a Doherty amplifier. The predistortion circuit is adapted to be coupled to a downstream Doherty amplifier to precompensate for the gain compression and phase expansion of the downstream Doherty amplifier as the input power level is increased while simultaneously reducing the intermodulation (IM) distortion. In order to provide precompensation, the precompensation circuit is operated at bias level to provide gain expansion and phase compression to cancel out the gain compression and phase expansion of the downstream Doherty amplifier to provide a higher overall linear power added efficiency (PAE).

11 Claims, 6 Drawing Sheets

U.S. PATENT DOCUMENTS

| | | | |
|---|---|---|---|
| 5,015,965 A * | 5/1991 | Katz et al. .................. 330/149 |
| 5,017,888 A | 5/1991 | Meinzer |
| 5,162,243 A | 11/1992 | Streit et al. |
| 5,262,335 A | 11/1993 | Streit et al. |
| 5,352,911 A | 10/1994 | Grossman |
| 5,420,541 A * | 5/1995 | Upton et al. ............ 330/124 R |
| 5,448,087 A | 9/1995 | Streit et al. |
| 5,534,820 A | 7/1996 | Tupper et al. |
| 5,568,086 A | 10/1996 | Schuss et al. |
| 5,631,477 A | 5/1997 | Streit et al. |
| 5,648,666 A | 7/1997 | Tran et al. |
| 5,672,522 A | 9/1997 | Streit et al. |
| 5,734,596 A | 3/1998 | Medelius et al. |
| 5,736,417 A | 4/1998 | Oki et al. |
| 5,739,723 A * | 4/1998 | Sigmon et al. ............ 330/295 |
| 5,757,229 A * | 5/1998 | Mitzlaff .................. 330/124 R |
| 5,786,727 A | 7/1998 | Sigmon |
| 5,804,487 A | 9/1998 | Lammert |
| 5,874,921 A | 2/1999 | Doherty et al. |
| 5,880,633 A | 3/1999 | Leizerovich et al. |
| 5,886,575 A * | 3/1999 | Long .......................... 330/129 |
| 5,994,194 A | 11/1999 | Lammert |
| 6,008,694 A | 12/1999 | El-Sharawy |
| 6,097,252 A * | 8/2000 | Sigmon et al. ............. 330/136 |
| 6,133,788 A * | 10/2000 | Dent ...................... 330/124 R |
| 6,211,733 B1 * | 4/2001 | Gentzler .................... 330/149 |
| 6,242,979 B1 * | 6/2001 | Li .............................. 330/149 |
| 6,262,629 B1 * | 7/2001 | Stengel et al. .......... 330/124 R |
| 6,320,462 B1 * | 11/2001 | Alley ..................... 330/124 R |
| 6,335,360 B1 * | 1/2002 | Schwartz et al. ........... 514/419 |
| 6,353,360 B1 * | 3/2002 | Hau et al. .................. 330/149 |
| 6,374,092 B1 * | 4/2002 | Leizerovich et al. ........ 455/127 |
| 6,417,731 B1 * | 7/2002 | Funada et al. .............. 330/149 |

OTHER PUBLICATIONS

Hau G, et al.: "A Linearized Power Amplifier mmic for 3.5 V battery operated wide–band cdma handsets", Microwave Symposium Digest. 2000 IEEE MTT–S International, Boston, MA, USA Jun. 11–16, 2000, Piscataway, NJ, USA, IEEE, pp. 1503–1506 XP010507140; ISBN: 0–7803–5687–X.

Patent Abstracts of Japan, vol. 018, No. 318 (E–1562), Jun. 16, 1994 & JP 06 069731 A (Mitsubishi Electric Corp), Mar. 11, 1994.

Kobayashi K W, et al.: An 18–21 GHz InP DHBT linear microwave Doherty amplifier:, 2000 IEEE Radio Frequency Integrated Circuits (RFIC) Symposium Digest of Papers (Cat. No. 00CH37096), 2000 IEEE Radio Frequency Integrated Circuits (RFIC) Symposium, Digest of Papers, Boston, MA, USA, Jun. 11–13, 2000, 2000, Piscataway, NJ, USA, IEEE, USA, pp. 179–182, XP002277031; ISBN: 0–7803–6280–2.

* cited by examiner

APPLICATION OF THE DOHERTY AMPLIFIER AS A PREDISTORTION CIRCUIT FOR LINEARIZING MICROWAVE AMPLIFIERS

CROSS-REFERENCE TO RELATED APPLICATIONS

This application is related to commonly-owned co-pending patent applications: "HEMT-HBT Doherty Microwave Amplifier", by Kevin Kobayashi, Ser. No. 09/878,106, filed concurrently herewith, and "Asymmetrically Biased High Linearity Balance Amplifier," by Kevin W. Kobayashi, Ser. No. 09/878,113, filed concurrently herewith.

BACKGROUND OF THE INVENTION

1. Field of the Invention

The present invention relates to a power amplifier and more particularly to a microwave power amplifier topology that provides predistortion to precompensate for gain compression and phase expansion of a downstream power amplifier.

2. Description of the Prior Art

Radio frequency and microwave communication systems are known to place ever-increasing demands on the linearity and efficiency of power amplifiers. Unfortunately, conventional power amplifiers operate at maximum efficiency at or near saturation. Thus, in order to accommodate communication signals having varying amplitudes, systems utilizing conventional power amplifiers normally operate at less than peak efficiency for a substantial portion of the time.

In order to solve this problem, so-called Doherty amplifiers have been developed. Doherty amplifiers were first introduced by an inventor having the same name in; "Radio Engineering Handbook" $5^{th}$ edition, McGraw Hill Book Company, 1959, pp. 18–39, as well as U.S. Pat. No. 2,210,028. The standard topology for a Doherty amplifier includes a carrier amplifier, operated in a Class AB mode and peak amplifier operated in a Class C mode. A quadrature Lange coupler is used at the input so that the carrier amplifier and peak amplifier signals will combine in phase. A quarter wave amplifier is provided at the outputs of the amplifier. In essence, the carrier amplifier operates at a point where the output begins to saturate for maximum linear efficiency. The peak amplifier is used to maintain the linearity of the output signal when the carrier amplifier begins to saturate.

Such Doherty amplifiers have been known to be used in various microwave and RF applications. Examples of such applications are disclosed in U.S. Pat. Nos. 5,420,541; 5,880,633; 5,886,575, 6,097,252 and 6,133,788. Examples of such Doherty amplifiers are also disclosed in "A Fully Integrated Ku-Band Doherty Amplifier MMIC," by C. F. Campbell, *IEEE Microwave and Guided Wave Letters*, Vol. 9, No. 3, March 1999, pp. 114–116; "An 18–21 GHz InP DHBT Linear Microwave Doherty Amplifier", by Kobayashi et al, 2000 *IEEE Radio Frequency Integrated Circuits Symposium Digest of Papers*, pages 179–182; "A CW 4 Ka-Band Power Amplifier Utilizing MMIC Multichip Technology," Matsunaga, et al., 1999, *GaAs IC Symposium Digest*, Monterey, Calif., pp. 153–156, all hereby incorporated by reference.

Known Doherty amplifiers experience gain compression and phase expansion as the input power level is increased. While gain expansion and phase compression can be achieved operating the amplifier in Classes B and C, such operation increases the intermodulation (IM) distortion. Thus, a circuit is needed to compensate for the gain compression and phase expansion as the input power level is increased without increasing the IM distortion.

SUMMARY OF THE INVENTION

The present invention relates to a predistortion circuit for a microwave amplifier and more particularly to predistortion circuit configured as a Doherty amplifier. The predistortion circuit is adapted to be coupled to a downstream Doherty amplifier to precompensate for gain compression and phase expansion as the input power level is increased while simultaneously reducing the intermodulation (IM) distortion. In order to provide precompensation, the precompensation circuit is operated at a bias level to provide gain expansion and phase compression to cancel out the gain compression and phase expansion of the downstream Doherty amplifier to provide a higher overall linear power added efficiency (PAE).

DESCRIPTION OF THE DRAWINGS

These and other advantages of the present invention will be readily understood with reference to the following specification and attached drawing wherein.

DETAILED DESCRIPTION OF THE INVENTION

The present invention relates to a predistortion circuit for a Doherty amplifier, which precompensates for the gain compression and phase expansion of a downstream Doherty power amplifier. The predistortion circuit may be configured as a Doherty amplifier but operated at biasing points to provide gain expansion and phase compression to cancel out the gain compression of the phase expansion of the downstream Doherty power amplifier while simultaneously lowering the intermodulation (IM) distortion.

Figure 1:
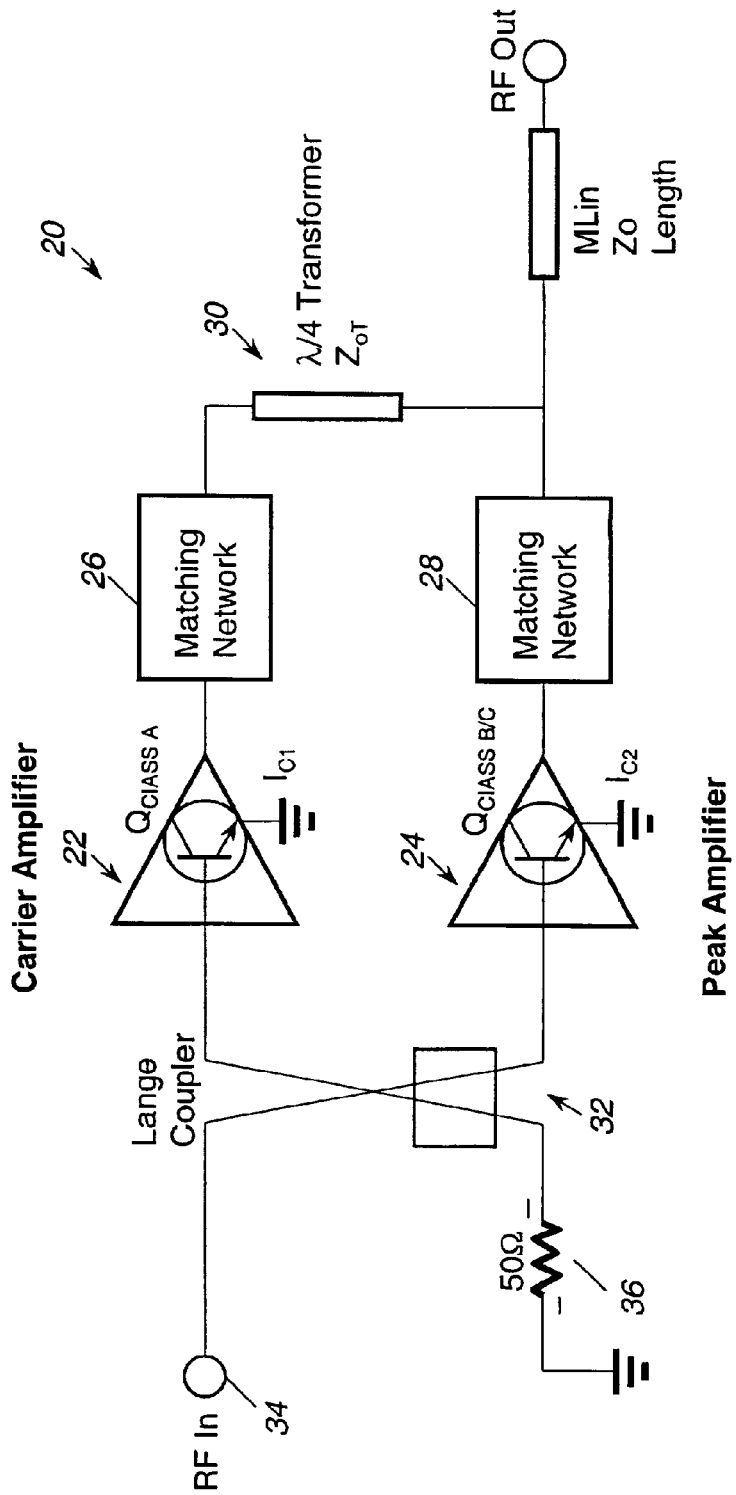
FIG. 1 is a schematic diagram of an InP microwave amplifier configured as a Doherty amplifier.

Microwave power amplifiers, for use with the present invention, are identified with the reference numeral 20 and illustrated in FIG. 1. The microwave power amplifier 20 includes a carrier amplifier 22 and a peak amplifier 24. Both the carrier amplifier 22 and the peak amplifier may be formed from heterojunction bipolar transistors (HBT) 22 and in particular as a prematched 1.5×30 $\mu m^2$×four finger InP DHBT device with a total emitter area of 180 $\mu m^2$. An example of such a device is disclosed in "An 18–21 GHz InP DHBT Linear Microwave Doherty Amplifier", by Kobayashi et al, 2000 *IEEE Radio Frequency Integrated Circuits Symposium Digest of Papers*, pages 179–182, hereby incorporated by reference. Methods for fabricating HBTs are extremely well known in the art, for example, as disclosed in commonly owned U.S. Pat. Nos. 5,162,243; 5,262,335;

5,352,911; 5,448,087; 5,672,522; 5,648,666; 5,631,477; 5,736,417; 5,804,487 and 5,994,194, all hereby incorporated by reference.

In order for the output signals from the carrier amplifier 22 and the peak amplifier 24 to be in phase at the output, a Lange coupler 32 is provided. One input terminal of the Lange coupler 32 is used as a RF input port 34. The other input terminal is terminated to an input resistor 36. One output terminal of the Lange coupler 32 is coupled to the input of the carrier amplifier 22 while the other output terminal is coupled to the input to the peak amplifier 24. A λ/4 impedance transformer having a characteristic impedance $Z_o=2R_L+R_{opt}$ is provided at the output of the amplifiers 22 and 24. An output terminal of the power amplifier 20 is terminated to load impedance $R_L$. Both the carrier amplifier 22 and the peak amplifier 24 are configured to deliver maximum power when the load impedance $R_L$ is $R_{opt}$.

The carrier amplifier 22 may be operated as a Class A amplifier while the peak amplifier 24 is operated as a Class B/C amplifier. In order to improve the isolation between the carrier amplifier 22 and the peak amplifier 24, for example, when the carrier amplifier 22 is biased as a Class A amplifier and the peak amplifier 24 is biased between Class B and C, matching networks 26 and 28 may be coupled to the output of the carrier amplifier 22 and the peak amplifier 24. As such, the impedance of each amplifier stage will not contribute to the inter-modulation (IM) performance of the other stage.

As set forth in: "A Fully Integrated Ku-Band Doherty Amplifier MMIC," supra, the loading impedance presented to the carrier and peak amplifiers of known Doherty amplifiers is a function of the output power delivered by the peak amplifier. During low input drive levels (i.e. levels in which the RF input amplitude is low), the peak amplifier is turned off resulting in a configuration in which the carrier amplifier saturates at a relatively low input drive level. As such, the carrier amplifier will result in a higher power added efficiency (PAE) at lower input power levels. As the input power level increases, the peak amplifier will begin to turn on as the power delivered by the peak amplifier increases. The load presented to the carrier amplifier decreases allowing the carrier amplifier 24 to increase to provide power to the load.

Figure 5A:
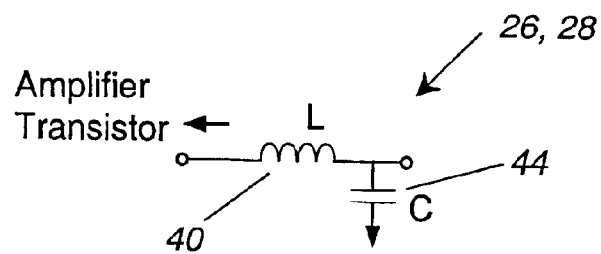
FIGS. 5A–5C illustrate matching networks for use with the present invention.
Figure 5B:
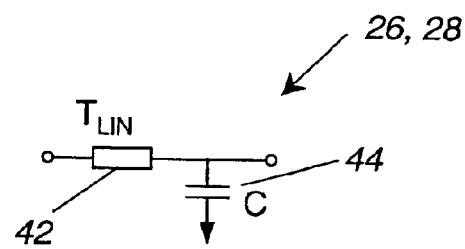
Figure 5C:
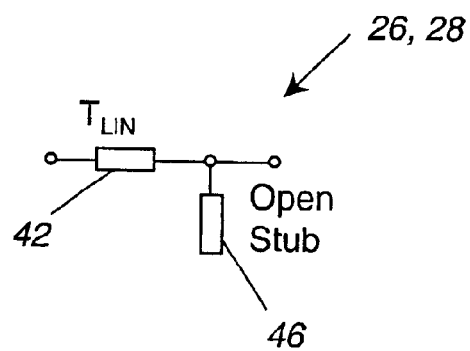

The matching networks 26 and 28 are serially coupled to the outputs of the carrier and peak amplifiers 22 and 24, respectively. These matching networks 26 and 28 may be provided as low pass networks, for example, as illustrated in FIGS. 5A–5C. As shown in FIGS. 5A–5C, the matching networks 26, 28 may be implemented as a series inductance 40 or transmission line 42 and a shunt capacitance 44 or open stub 46. In operation, when the carrier amplifier 22 is on and the peak amplifier 24 is off, the watching networks 26, 28 provide a relatively high impedance (mainly due to the high impedance transmission line 42 or inductance 40) such that the peak amplifier 24 does not load down the carrier amplifier 22, operating in class A, to achieve optimum linearity and efficiency under low input power conditions.

The theory of operation of the matching networks 26, 28 is contrary to the operation of matching networks used for conventional power amplifiers. More particularly, typically in a power amplifier application a low impedance series transmission line or low impedance shunt capacitance or open stub is provided at the output of the power transistor in order to efficiently transform the low impedance of the power transistor to a higher manageable impedance as well as provide isolation between the amplifying transistors.

Figure 6A:
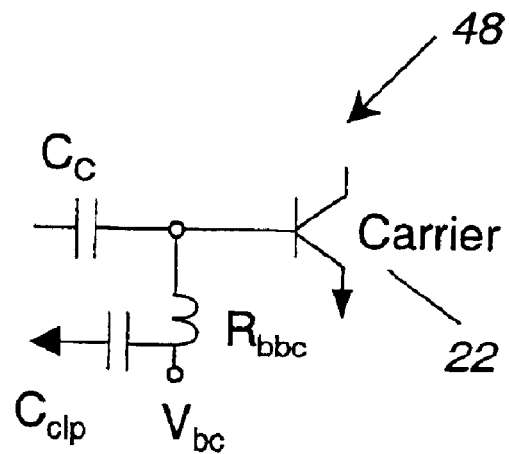
FIGS. 6A–6B illustrate biasing networks for use with the carrier and peak amplifiers of the present invention.
Figure 6B:
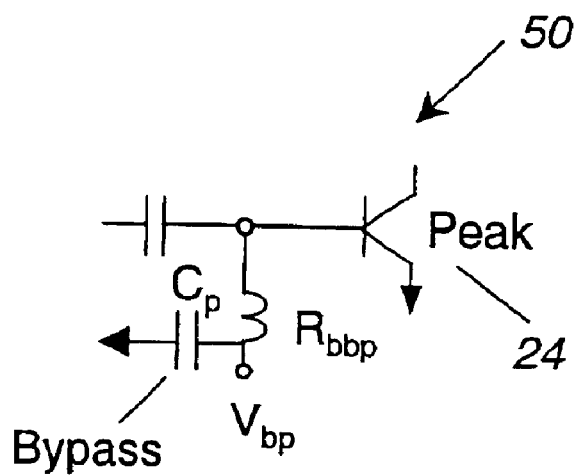

Various biasing networks can be used for tuning the carrier and peak amplifiers 22 and 24. Exemplary biasing networks 48 and 50, are illustrated in FIGS. 6A and 6B. Each of the biasing networks 48, 50 include a biasing resistor. $R_{bbc}$ or $R_{bbp}$, coupled to an external source of DC, $V_{bc}$ or $V_{bp}$. A low pass capacitor $C_{cip}$ or $C_{plp}$ is coupled to the biasing resistor, $R_{bbc}$ or $R_{bbp}$, the external source DC voltage, $V_{bc}$ or $V_{vp}$, and ground to filter out noise. Coupling capacitors $C_{cc}$, $C_{cp}$ may be used to couple the carrier and peak amplifiers 22 and 24 to the Lange coupler 32.

The biasing circuits, for example, the biasing circuits 48 and 50, enable one or the other or both the carrier amplifier 22 and peak amplifier to be electronically turned. In the case of the exemplary biasing circuits 48 and 50, illustrated in FIGS. 6A and 6B, respectively, the biasing of the carrier and peak amplifiers 22 and 24 may be varied by varying the amplitude of the external DC voltage $V_{bc}$, $V_{bp}$ coupled to the input of the carrier and peak amplifiers 22 and 24.

The electronic tuning of the carrier and peak amplifiers 22 and 24, as provided by the biasing circuits 48 and 50, provides many important advantages in accordance with the present invention. First, the electronic tuning allows the carrier and peak amplifiers 22 and 24 to be tuned for optimal linearity. Secondly, electronic tuning allows for improved intermodulation distortion over a relatively wide input power range. As such, the amplifier 20 can be tuned such that the operating range (i.e. carrier amplifier frequency) has the maximum IM rejection possible. Moreover, as discussed above, the relatively high impedance of the matching networks 26 and 28 results in the virtual isolation of the IM products of the carrier amplifier 22 and peak amplifier 24, therefore, providing less IM products. Lastly, the electronic tuning can also be used to provide gain expansion and phase compression for use in predistortion linearization applications.

Figure 2:
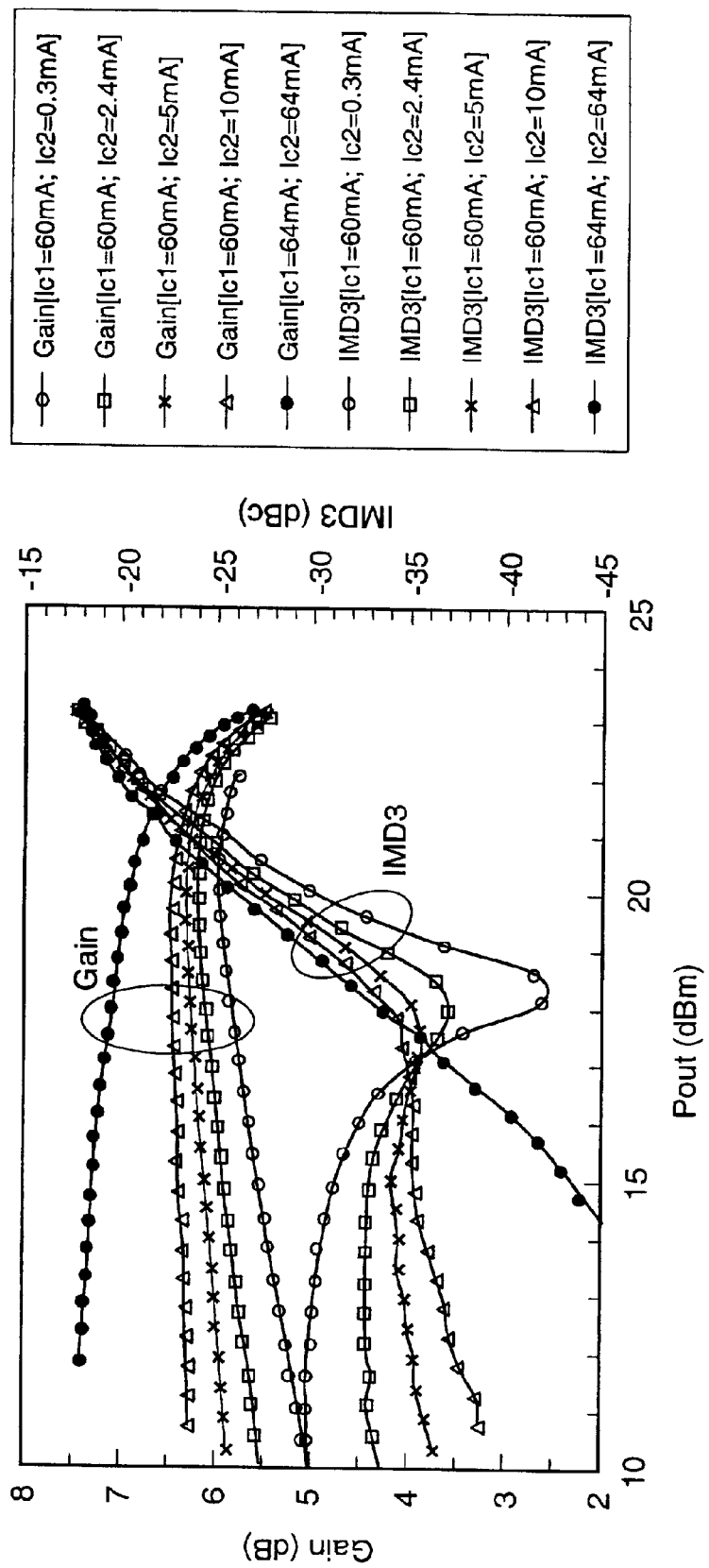
FIG. 2 is a graphical representation of the output power of the amplifier illustrated in FIG. 1 as a function of the gain and intermodulation (IM) distortion for various biasing points.

FIG. 2 illustrates the measured gain and IM3 (third order modulation products) as a function of output power at 21 GHz for various biasing conditions of the amplifier 20. In particular, the IM3 and gain is illustrated for Class A bias operation (Ic1=64 mA; Ic2=64 mA) as well as asymmetric bias conditions. In particular, the asymmetrically biased conditions are illustrated when the peak amplifier 24 is off and the carrier amplifier 22 is biased in a Class A mode (IC1=60–64 mA) and the peak amplifier is bias in Class B (IC2=0.3–10 mA). As illustrated in FIG. 2, adjustment of the peak amplifier biased current (IC2) allows the shape and performance of the IM3 linearity ratio to be significantly improved across a relatively wide output power range. During a biasing condition (i.e. Ic1=60 mA; Ic2=0.3 mA), when the peak amplifier is nearly shut off, the microwave power amplifier 20 achieves a relatively dramatic improvement of the IM3 ratio resulting in a deep IM3 cancellation of about —43 dBc.

Figure 3:
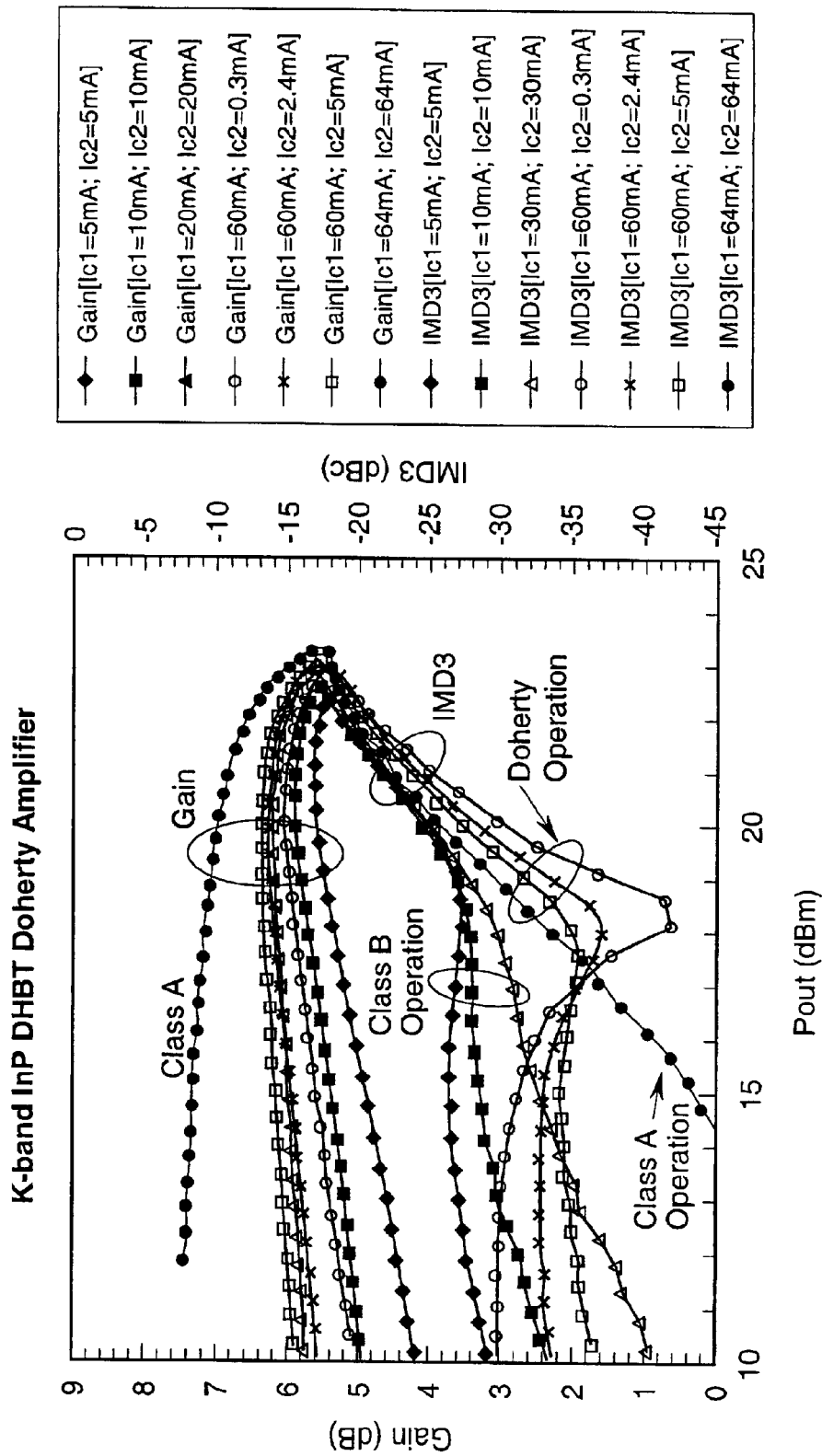
FIG. 3 is similar to FIG. 2 but at different biasing points.

FIG. 3 illustrates the gain and intermodulation distortion of the Doherty amplifier at levels relative to the biasing levels illustrated in FIG. 2. As shown, for Class A operation, the Doherty amplifier 20 experiences gain compression as well as an increase in IM distortion.

In accordance with an important aspect of the invention, the Doherty amplifier has a gain expansion and phase compression characteristic when operated in Class B. However, operation of the Doherty amplifier 20 in Class B significantly increases the IM distortion. In accordance with the present invention, a predistortion circuit configured as a Doherty driver amplifier 40 is used to precompensate the gain compression and phase expansion of the Doherty amplifier 20.

Figure 4:
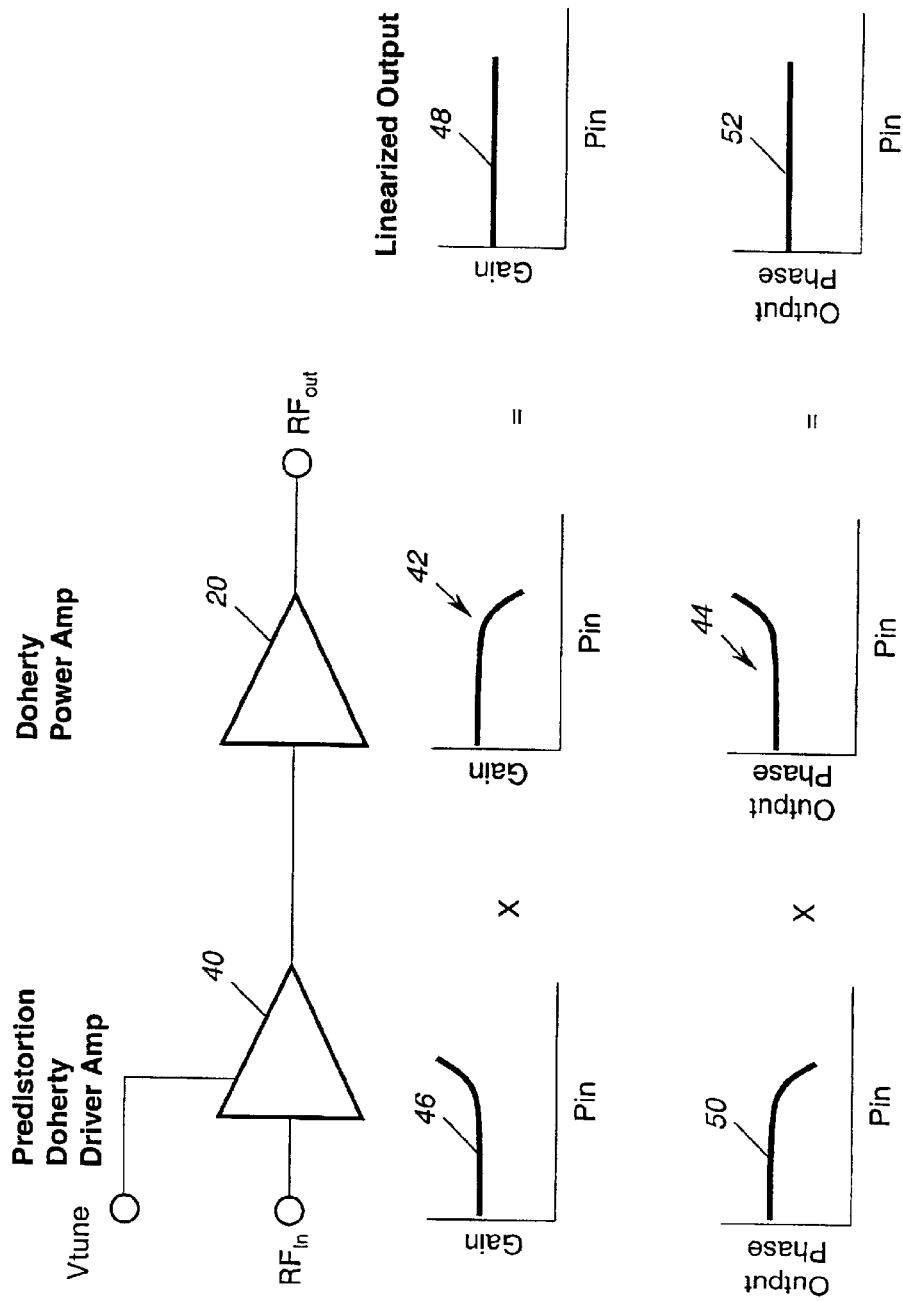
FIG. 4 is a schematic diagram of a predistortion circuit used as a driver amplifier and a Doherty power amplifier in accordance with the present invention.

Referring to FIG. 4, the predistortion circuit is generally identified with the reference numeral 40 and is adapted to be disposed upstream of the microwave power amplifier 20 to provide predistortion such that the gain and the output phase of the microwave power amplifier 20 is generally linear over the output power range. The predistortion microwave power amplifier 40 may be configured exactly the same as the microwave power amplifier 20, however, operated at different bias points. As shown in FIG. 4, the gain and output phase of the amplifier 20 is a function of the input RF signal level, generally indicated by the curves identified with the reference numerals 42 and 44. As shown in FIG. 3, for various bias points, for example, in Class A, the bias curves show gain compression as the RF power level is increased. However, FIG. 3 also illustrates that at various bias points, for example, the Class B bias curves provide gain expansion to provide a gain expansion curve having a characteristic as identified by the curve 46 in FIG. 4. Thus, by carefully selecting the bias points for the predistortion microwave driver amplifier 40 and the microwave power amplifier 20, a linearized output from the microwave power amplifier 20 can be realized, as illustrated by the curve 48, over the input power range of the amplifier. Similarly, the selected bias level for the microwave amplifier 40 may be selected to provide a bias characteristic to provide a phase compression characteristic as illustrated by the curve 50. As such, by predistorting the RF input signals applied to the predistortion Doherty driver amplifier 40, a relatively linear output phase curve 52 can be achieved for the entire range of input power applied to the Doherty power amplifier 20. Based on amplitude and phase predistortion characteristics, the cascaded predistorter and output should result in a linear output. The predistortion circuit will have poorer IM distortion by itself, but the cascade performance should be linear when viewed from amplitude and phase perspective. Amplitude and phase are develop characteristics which reflect the aggregate effect of multiple signals going through the amplifier.

Obviously, many modification and variations of the present invention are possible in light of the above teachings. For example, thus, it is to be understood that, within the scope of the appended claims, the invention may be practiced otherwise than as specifically described above.

What is claimed and desired to be secured by Letters Patent of the United States is:

I claim:

1. A predistortion driver circuit for a serially connected downstream Doherty power amplifier having predetermined characteristics, the predistortion driver circuit comprising:

a Doherty driver amplifier having a carrier amplifier and a peak amplifier, each of said carrier and peak amplifiers having a respective bias level, the bias levels for said Doherty driver amplifier selected to provide for predistortion of predetermined characteristics of said serially connected downstream Doherty power amplifier, wherein said predetermined characteristics selected to provide gain expansion as a function of input power level.

2. A predistortion driver circuit for a Doherty power amplifier having predetermined characteristics, the predistortion driver circuit comprising:

a Doherty driver amplifier having a carrier amplifier and a peak amplifier, each of said peak and carrier amplifiers having a respective bias level, the bias levels for said Doherty driver amplifier selected to provide for predistortion of predetermined characteristics of the bias levels of said Doherty power amplifier, wherein the bias levels are selected to provide phase compression as a function of input power level, wherein said predetermined characteristics include gain as a function of input power level and phase and wherein said bias levels are selected to provide gain expansion as a function of input power level.

3. A linear power amplifier circuit comprising:

a Doherty power amplifier having predetermined characteristics including input power range as a function of RF input power; and an upstream predistortion driver circuit configured as a Doherty amplifier, serially coupled to said Doherty power amplifier, said upstream predistortion driver circuit having characteristics selected to precompensate for said predetermined characteristics of said power amplifier as a function of input power, wherein said predetermined characteristic include gain as a function of input power level and phase and wherein said bias level is selected to provide gain expansion as a function of input power level.

4. The linear power amplifier circuit as recited in claim 3, wherein said Doherty power amplifier has a predetermined gain compression characteristic as a function of input power.

5. The linear power amplifier circuit as recited in claim 3, wherein said upstream predistortion driver circuit is configured to have a gain expansion characteristic such that the output gain of the circuit is relatively linear over the input power range of the power amplifier.

6. A linear power amplifier circuit comprising:

a Doherty power amplifier having predetermined characteristics including input power range as a function of RF input power; and an upstream predistortion driver circuit configured as a Doherty amplifier, serially coupled to said Doherty power amplifier, said predistortion circuit having characteristics selected to precompensate for said predetermined characteristics of said power amplifier as a function of input power, wherein said Doherty power amplifier having a predetermined phase compression characteristic as a function of input power, wherein said predetermined characteristics include gain as a function of input power level and phase and wherein said bias levels are selected to provide gain expansion as a function of input power level.

7. The linear power amplifier circuit as recited an claim 6, wherein said upstream predistortion driver circuit is configured to have a phase expansion characteristic such that the output gain of the circuit is relatively linear over the input range of the power amplifier.

8. A linear power amplifier circuit comprising:

a Doherty power amplifier having predetermined characteristics including an input power range as a function of RF input power;

an upstream predistortion driver circuit configured as at Doherty driver amplifier for precompensating said predetermined characteristics of said Doherty power amplifier; and a circuit for electronically tuning said upstream predistortion circuit so that a predetermined characteristic of the linear power amplifier circuit is linear over the input power range of the Doherty power amplifier, said electronic tuning circuit configured to adjust the bias characteristic of said upstream predistortion circuit, wherein said predetermined characteristics include gain as a function of input power level mid phase and wherein said bias levels of said Doherty driver amplifier are selected to provide gain expansion as a function of input power level.

9. The linear power amplifier circuit as recited in claim 8, wherein said predetermined characteristic is the output gain of the linear power amplifier circuit, wherein said tuning means enables bias level to be adjusted so that the overall output gain of the Doherty power amplifier and upstream predistortion circuit is relatively linear over the input range of the Doherty power amplifier.

10. A linear power amplifier circuit comprising:
   a Doherty power amplifier having predetermined characteristics including an input power range as a function of RF input power;
   an upstream predistortion circuit configured as a Doherty driver amplifier for precompensating said predetermined characteristics of said Doherty power amplifier; and
   a circuit for electronically tuning said upstream predistortion circuit so that a predetermined characteristic of the linear power amplifier circuit is linear over the input power range of the Doherty power amplifier, wherein said power amplifier is configured as a Doherty amplifier having a predetermined phase compression characteristic as a function of input power, wherein said predetermined characteristics further include gain as a function of input power level and wherein said bias levels are selected to provide gain expansion as a function of input power level.

11. The linear power amplifier circuit as recited in claim 10, wherein said tuning means includes means for electronically tuning the predistortion circuit such that the output phase characteristic of the linear power amplifier circuit is relatively linear over the input range of the power amplifier.

* * * * *

UNITED STATES PATENT AND TRADEMARK OFFICE
CERTIFICATE OF CORRECTION

PATENT NO.   : 6,864,742 B2
DATED        : March 8, 2005
INVENTOR(S)  : Kevin W. Kobayashi It is certified that error appears in the above-identified patent and that said Letters Patent is hereby corrected as shown below:

Column 6,
Lines 65-69, should read as follows:
-- wherein said predetermined characteristics include gain as a function of input power level and phase and wherein said bias levels of said Doherty driver amplifier are selected to provide gain expansion as a function of input power level. --.

Signed and Sealed this

Eighth Day of November, 2005

JON W. DUDAS
*Director of the United States Patent and Trademark Office*